United States Patent
Dittrich et al.

(10) Patent No.: US 7,161,980 B2
(45) Date of Patent: Jan. 9, 2007

(54) RECEIVER FOR HIGH RATE DIGITAL COMMUNICATION SYSTEM

(75) Inventors: Andreas Dittrich, Sippersfeld (DE); Wolfgang Emil Michael Sauer-Greff, Kaiserslautern (DE); Ralph Steffen Urbansky, Kaiserslautern (DE)

(73) Assignee: Lucent Technologies Inc., Murray Hill, NJ (US)

( * ) Notice: Subject to any disclaimer, the term of this patent is extended or adjusted under 35 U.S.C. 154(b) by 750 days.

(21) Appl. No.: 10/223,151

(22) Filed: Aug. 19, 2002

(65) Prior Publication Data

US 2004/0032905 A1 Feb. 19, 2004

(51) Int. Cl.
*H03H 7/30* (2006.01)
*H03D 1/24* (2006.01)

(52) U.S. Cl. .................. 375/233; 375/232; 375/321

(58) Field of Classification Search ............ 375/233, 375/232, 321
See application file for complete search history.

(56) References Cited

U.S. PATENT DOCUMENTS

| | | | |
|---|---|---|---|
| 5,872,815 A * | 2/1999 | Strolle et al. ............ 375/321 |
| 6,366,613 B1 * | 4/2002 | Sommer et al. ........... 375/232 |
| 6,414,990 B1 * | 7/2002 | Jonsson et al. ............ 375/232 |
| 6,744,814 B1 * | 6/2004 | Blanksby et al. .......... 375/232 |
| 6,961,373 B1 * | 11/2005 | Jones ...................... 375/232 |
| 2001/0019584 A1 * | 9/2001 | Azazzi et al. ............. 375/233 |
| 2002/0122480 A1 * | 9/2002 | Abnous et al. ............ 375/233 |
| 2003/0002602 A1 * | 1/2003 | Kwon et al. .............. 375/340 |

* cited by examiner

*Primary Examiner*—Khai Tran
*Assistant Examiner*—Cicely Ware
(74) *Attorney, Agent, or Firm*—Eugene J. Rosenthal

(57) ABSTRACT

A system and method for processing received transmission signal(s) adapted to be used in high rate communication systems without impairing the received signal energy and without additional expensive components. The system and method are adapted to transmission system(s) having at the receiver-side a compound system of a feed-forward equalizer (FFE) and a subsequent decision feedback equalizer (DFE). A feed forward equalization and/or a decision feedback equalization is performed on the received high rate signal by deriving adaptation information from the equalized signal after a signal decision is performed for adjusting all intended feed forward equalization and/or decision feedback equalization coefficients and/or table entries in dependence on said information.

5 Claims, 3 Drawing Sheets

RECEIVER FOR HIGH RATE DIGITAL COMMUNICATION SYSTEM

FIELD OF THE INVENTION

The invention relates to a method of processing a received high rate transmission signal and to a receiver for high rate digital communication systems.

BACKGROUND OF THE INVENTION

In general, transmission impairments in lightwave systems mainly results from linear and non-linear signal dispersion, noise and intermodulation in case of multiple signals. Dispersion broadens the width of pulses, resulting in inter-symbol-interference (ISI) which limits the maximum bit rate of the system. In particular the mono-mode fiber characteristics of chromatic dispersion caused by frequency dependent delay and attenuation and of polarization mode dispersion (PMD) denoting the propagation of two polarization modes with different frequency dependent signal delays superimposing at the photodiode result in linear and non-linear ISI.

Furthermore, limited laser and receiver bandwidth and an enlarged spectral shape of the transmitted pulses due to a laser phase noise increase ISI.

In the past decades, progress in fiber and laser technologies has reduced many of these impairments considerably, so that in particular for bit rates below 2.5 Gbit/s a threshold detection without equalization may be used in fiber-optic-digital communications since the amount of ISI is small enough to guarantee a high signal-to-noise ratio (SNR) and therefore a bit error ratio (BER) well below $10^{-12}$.

However, for bit rates of at least 10 Gbit/s, such as used for example within optical long distance traffic communication systems, the amount of ISI is significantly enlarged. Such communication systems usually using standard-mono-mode fibers, erbium-doped fiber amplifiers and non-coherent optical receivers are still disturbed by non-linear dispersion and signal dependent non-Gaussian noise resulting in a decreased SNR which is additionally decreased by reduced signal power due to wavelength multiplexing or longer coverage distances.

To improve the BER for a given SNR, forward error correcting (FEC) channel coding may be applied. Different FEC coding schemes like BCH-codes (Bose-Chaudhury-Hoequengheen-codes) and RS-codes (Reed-Solomon-codes) are used fitting into the Sonet/SDH digital wrapper format. Based on the redundancy included into the data stream by the encoder at the transmitter-side the decoder at the receiver-side is enabled to correct up a certain amount of transmissions errors. If the number of channel bit errors is below the error correction capability of the FEC code, all bit errors can be corrected, and in addition erroneous channel bits can be marked.

However for ISI, FEC is less suitable. In this regard ISI may be mitigated by an adaptive equalizer at the receiver-side. Well known types are feed forward equalizers (FFE) and decision feedback equalizers (DFE). Particularly, decision-feedback equalization is a widely-used technique for removing inter-symbol-interference where noise enhancement caused by a linear FFE may introduce performance problems. In any case however, for equalizer adjustment, usually an appropriate channel model has to be extracted out of the received analogue signal resulting in an additional expensive circuitry.

In particular in digital transmission systems comprising a receiver including a FFE and a subsequent decision feedback equalizer (DFE) the respective coefficients of the FFE and the respective coefficients of the DFE have to be adjusted separately. This is achieved by extracting an appropriate channel model out of the received analogue signal, thereby needing at least the sign information of the analog signal present at the corresponding tap for each of the adjustment, respectively. Hence, based on the access to the received signal, which has to be analogue-to-digital converted an additional expensive circuitry is required. Additionally, due to slowly time varying distortions, the respective coefficients have to be adapted to the channel permanently.

Moreover, for high rate data transmission of at least 10 Gbit/s a further main problem is to implement an additional sampling device and an analogue-to-digital converter for delivering necessary information for adaptation. The additional signal path however, also results in a loss of signal energy which impairs the main data detection process.

SUMMARY OF THE INVENTION

It is an object of the invention to provide, in particular with regard to the afore-discussed state of the art, a new and improved approach for processing a received transmission signal adapted to be used in high rate communication systems without impairing the received signal's energy and without additional expensive components, especially adapted to a transmission system having at the receiver-side a compound system of a feed-forward equalizer and a subsequent decision feedback equalizer.

According to an aspect of the Invention, a method of processing a received transmission signal adapted for the use within a high rate communication system comprises the steps of: performing on the received signal a feed forward equalization and a decision feedback equalization by deriving information from the equalized signal after a signal decision is performed and adjusting intended feed forward equalization coefficients and decision feedback equalization coefficients or table entries depending on said information. It further comprises the steps of performing a forward error correction on said equalized signal, generating control values in dependence on symbols of the equalized signal prior to said error correction and symbols of the corrected signal at defined time instants. Each equalization coefficient or table entry is adapted in dependence on a respective previous equalization coefficient or table entry and on said control values, in particular based on a selectable adaptation step size parameter. An appropriate time delay is adjusted for ensuring a maximum average agreement of corrected symbols and decided output symbols at defined time instants.

According to another aspect of the invention, a receiver for a high rate communication system comprises a feed forward equalizer and a decision feedback equalizer with said equalizer(s) connected to a signal detection device having means for receiving a transmission signal, means for deriving information from the transmission signal after said signal detection device, and updating means for adjusting all intended feed forward equalization coefficients and decision feedback equalization coefficients or table entries in dependence on said information. Means are included for decoding digital symbols after said decision feedback periodically at definable time instants, for performing an error rate evaluation based on channel or error coding information embedded within the transmission signal, and for generating adaptation control values using said error rate evaluation. Also included, are means for performing a forward error correction, means for generating adaptation control values in dependence on corrected symbols and decided detection device output symbols at defined time instants, and means for adapting each intended equalization coefficient or table entry in dependence on the respective previous equalization coefficient or table entry and on said control values, in particular based on a selectable adaptation step size parameter. Means are included for adjusting an appropriate time delay for ensuring a maximum average agreement of corrected symbols and decided output symbols at defined time instants.

Advantageous and/or preferred embodiments or refinements are the subject matter of the respective dependent claims.

Accordingly, the invention proposes to perform on the received high rate signal a feed forward equalization and/or a decision feedback equalization by deriving adaptation information from the equalized signal after an equalized signal decision is performed for adjusting all or respectively intended coefficients and/or table entries for the feed forward equalization and/or decision feedback equalization in dependence on said information.

Thus by preferably using a receiver for a high rate communication system, comprising a feed forward equalizer and/or a decision feedback equalizer connected to an equalized signal detection device, wherein the receiver has besides means for receiving a transmission signal means for deriving information from the transmission signal after said equalized signal detection device preferably designed as a threshold device, and updating means for adjusting the required feed forward equalizer and/or decision feedback equalizer coefficients and/or table entries in dependence on said information it is possible to simultaneously adjust all employed equalizers and/or detectors adaptively to the transmission channel without any additional measurement device requiring the received signal.

Therefore, high rate communication systems can be improved without impairing the received signals energy and without additional expensive components, resulting in extended regenerator spans and/or higher data rates.

Preferably, digital adaptation information is derived periodically at definable time instants and fed back for adaptively adjusting all coefficients or table entries simultaneously for accomplishing the inventive approach in a simple manner by a digital circuit.

In particular for deriving the adaptation information in an easy way, the invention proposes according to preferred embodiments, that the transmission signal is incorporating a channel or error coding information so that an error rate evaluation based on said coding information is performed for generating adaptation control values resulting in an improved error performance of the overall system. Moreover, since such generation of control values is based on the digital data stream only, the generation or calculation does not need any additional detector or analogue-to-digital converter.

According to very preferred embodiments it is suggested to perform a forward error correction on the equalized signal, i.e. after the decision or threshold device for generating the adaptation control values in dependence on corrected symbols at defined time instants and on decided symbols after the decision device at defined times instants.

In particular by using the bit errors which can be estimated by such forward error correction an equalizer adjustment of both, of the feed forward equalizer and/or of the decision feedback equalizer can be simply accomplished by the invention in dependence on the respective previous equalization coefficients and/or table entries and on said control values, preferably on a selectable adaptation step size parameter.

Moreover, with such inventive approach the number of equalizer coefficients is not restricted and can be adapted for adjusting coefficients and/or table entries of linear and/or non-linear equalizers.

The receiver is preferably further comprising means for adjusting the appropriate time delay, in particular in case of a block wise processing for the decoding of digital symbols after the decision device, for ensuring a maximum average agreement of corrected symbols and decided output symbols at defined time instants.

The invention is exemplary described in more detail in the following, based on a preferred embodiment and with regard to the appended drawings, in which:

DETAILED DESCRIPTION OF PREFERRED EMBODIMENTS

For a better understanding of the subsequent exemplar description of the invention and especially to easier ensure the inventive approach, certain requirements and assumptions with regard to preferred inventive embodiments and/or applications are made in advance.

Figure 4:
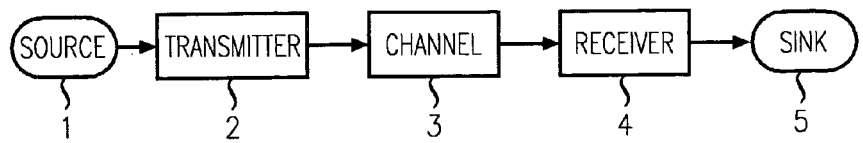
FIG. 4 is a schematic block diagram of a generic transmission system.

Regarding first FIG. 4, a generic digital transmission system is schematically depicted having fundamental components, such as a digital data source 1, a transmitter 2, a transmission channel 3, a receiver 4 and a data sink 5.

The transmitter 2 maps digital source data onto specific physical signals, such as for example voltage pulses. Within the transmission channel 3 these signals are corrupted by distortions and disturbances like noise.

According to the preferred embodiments of the invention and hence, within preferred applications of the inventive approach, the transmission channel comprises an optical channel such as an optical fiber so that the transmitter 2 is comprising an electrical-to-optical converter and the receiver 4 comprises an optical-to-electrical converter for converting the received optical signals back to electrical signals.

Finally after the reception of the transmission signal and/or after the conversion of the received optical signal back into an electrical signal the receiver 4 has to estimate the transmitted data out of the received signal.

Figure 5:
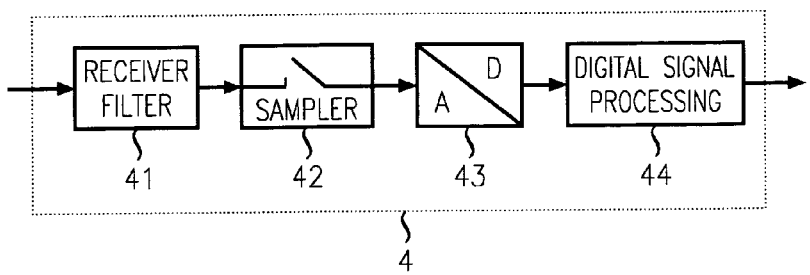
FIG. 5 is a schematic block diagram of the implementation of a nearly optimum receiver within the system of FIG. 4.

In this respect, from signal theory it can be shown that an optimum receiver 4 for gaussian distributed additive uncorrelated noise resulting in a minimum bit error ratio (BER) is preferably comprising a linear filter 41, a sampler 42 at the symbol rate 1/T and a device 44 processing these sampled values, as depicted in FIG. 5. Since a signal processing at reasonable expense however, is feasible digitally only, the processing device 44 usually is a digital signal processing device. Therefore the discrete time samples provided by the sampler 42 with the sampling phase are quantized by an analogue-to-digital converter (ADC) 43 prior to hand over said quantized values to the digital signal processing device 44.

Figure 6:
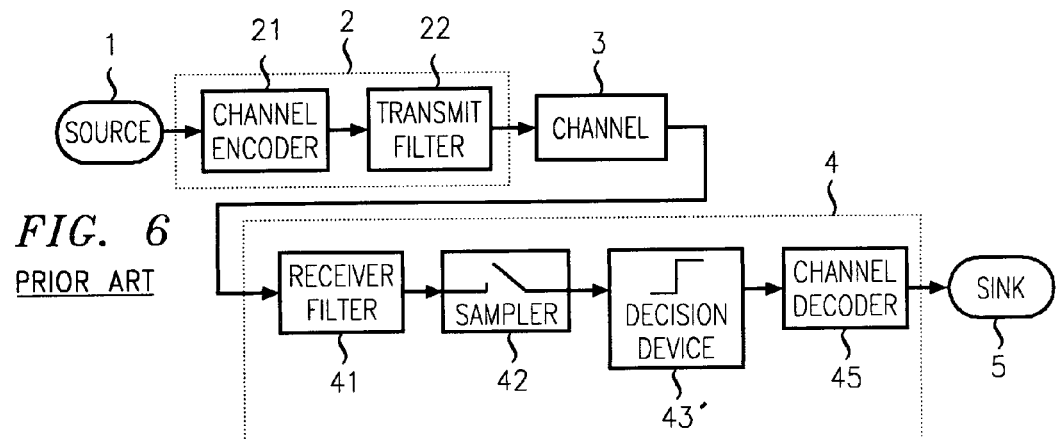
FIG. 6 is a schematic block diagram of a transmission system according to FIG. 4 incorporating forward error correction channel coding.

In case of negligible channel distortions, in particular if there is substantially no inter-symbol interference the analogue-to-digital converter 43 may be reduced to a single threshold device 43' and the digital signal processing device 44 can be omitted as can be seen in FIG. 6.

However, for compensating remaining residual noise, either the signal energy has to be chosen sufficiently high or an additional error coding has to be applied. In this respect the transmission system according to FIG. 6 is additionally involving at the transmitter-side 2, a channel encoder 21 and a transmit filter 22 and at the receiver-side 4 a channel decoder 45.

With regard to the additional error coding information two different methods may be distinguished. On the one hand side, an error detection combined with an automatic repeat request (ARQ) in case the decoding device 45 is detecting an error based on an check sum embedded within the transmission signal can be used. On the other hand side, an error correction approach using appropriate channel coding such as to incorporate within the data stream transmitted a forward error correction code comprising additional redundant bits so that errors may be detected and corrected at the receiver-side 4 can be used.

Both of these mechanisms result in reduced available data rates. Nevertheless, in many practical applications the use of error coding is beneficial due to a guaranteed low error rate.

However, error coding mechanisms in transmission systems with threshold devices is mainly designed to mitigate random disturbances like noise. As a consequence, when additional distortions exceed a certain amount, and hence the number of bit errors does exceed a certain number which depends on the respective designed error coding mechanisms even a highly elaborated error coding will not be able to attain reliable data transmission.

As a consequence, for further increasing the signal quality the receiving filter 41 has to be designed to at least partially compensate transmission induced signal distortions and to maximize the eye-opening of the received signals such that the following decision device 43' is enabled for carrying out best possible decisions. Such a designed receiving filter is called feed forward equalizer (FFE) 41' and widely used in data receivers. Furthermore, such FFEs 41' are mainly implemented as finite impulse response (FIR) or tapped delay line filters with an internal structure as schematically depicted in FIG. 3.

Figure 3:
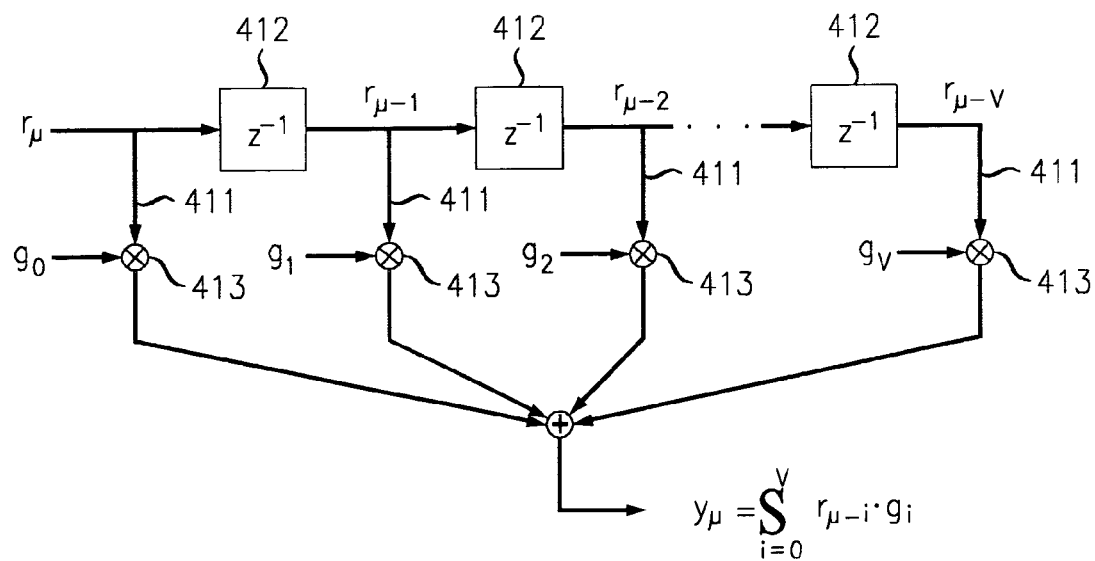
FIG. 3 is schematically showing the structure of a feed forward equalizer.

As can be seen in FIG. 3, an incoming signal $r_\mu$ is split into a certain number "V" of further signals or components $r_{\mu-1}$ to $r_{\mu-V}$ by means of tabs 411 which are tabbed from the incoming signal line. The split signals or components $r_\mu$, $r_{\mu-1}$ to $r_{\mu-V}$ are delayed with respect to each other by means of delay elements or lines 412 located intermediately between the tabs. Each of the split signals is processed by multiplying means 413, whereby the split signals $r_\mu$, $r_{\mu-1}$, to $r_{\mu-V}$ are separately multiplied or weighted by factors or coefficients $g_0$, $g_1$ to $g_V$, each of which is respectively assigned to a corresponding tap. The output signal $y_\mu$ then is generated by the superposition of the weighted components and can be expressed by $$y_\mu = \sum_{i=0}^{V} r_{\mu-i} \cdot g_i,$$

whereby the index $\mu$ denotes a definable time instant and $\mu-i$ denotes the i-fold delay.

Figure 7:
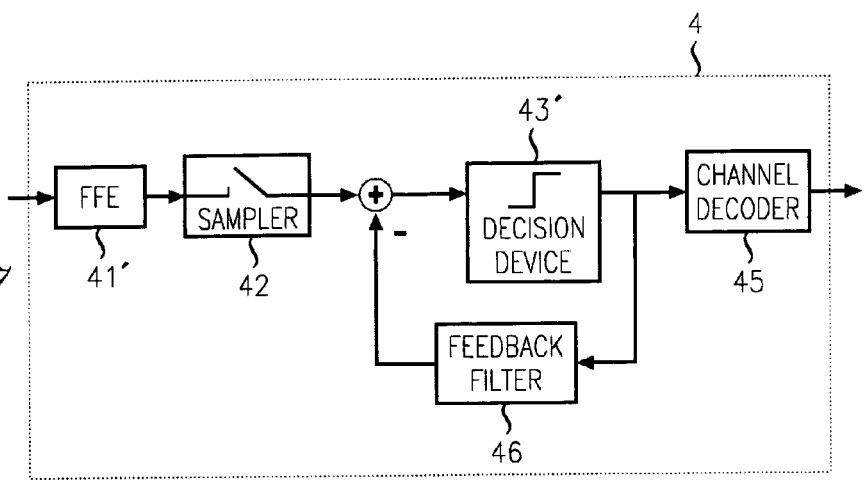
FIG. 7 is a schematic block diagram of a combined feed forward and decision feedback equalizer within a transmission system according to FIG. 4.

For the further signal processing the receiver 4 of a conventional transmission is comprising a decision feedback equalizer (DFE) comprising the decision device 43' and may comprise a feedback filter 46, as depicted by FIG. 7 showing a compound system with a FFE and DFE in its basic form. Such DFE is designed such, that decided symbols are used to compensate for consecutive distortions, wherein the principal concept of such a DFE-structure including a feedback filter is depicted in FIG. 2.

Figure 2:
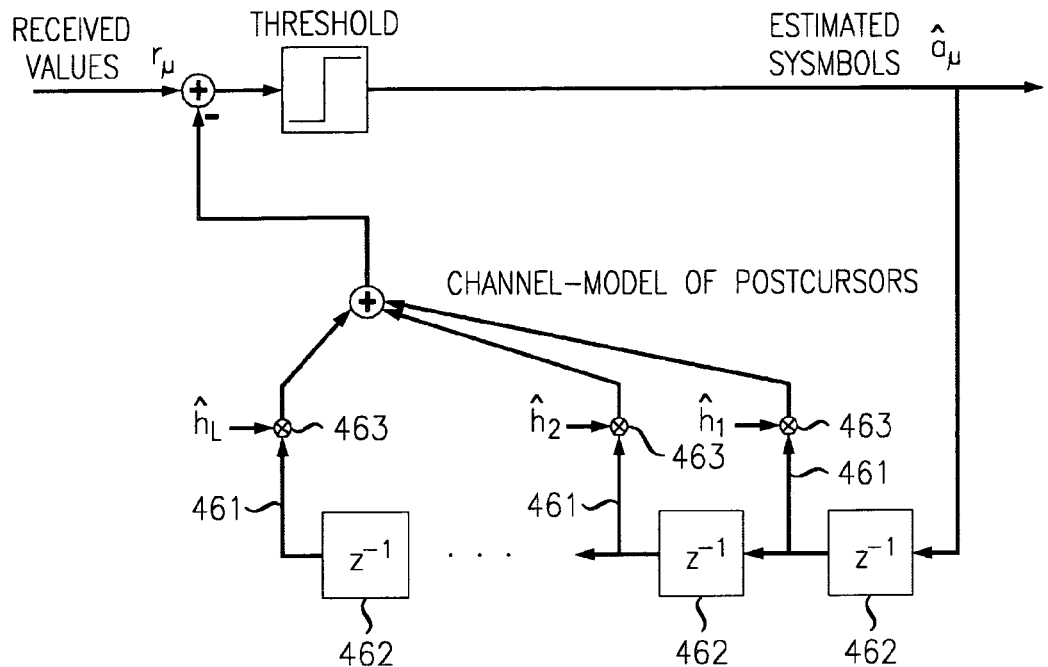
FIG. 2 is schematically showing the structure of a decision feedback equalizer.

As can be seen in FIG. 2, a decided signal symbol $\hat{a}_\mu$ is fed back and split into a certain number "L" of signal symbols or values by means of tabs 461 which are tabbed from the feeding back line. The split signal values or components are delayed with respect to each other by means of delay elements or lines 462 located intermediately between the tabs. Each of the split values is processed by multiplying means 463, whereby each split symbol is separately multiplied or weighted by a respective assigned factor or coefficient $\hbar_1$, $\hbar_2$ to $\hbar_L$. A signal generated by the superposition of the weighted symbols or values then is subtracted from the incoming sampled values $r_\mu$ to compensate for consecutive distortions and to forward to the threshold device for estimating the following symbol.

Figure 1:
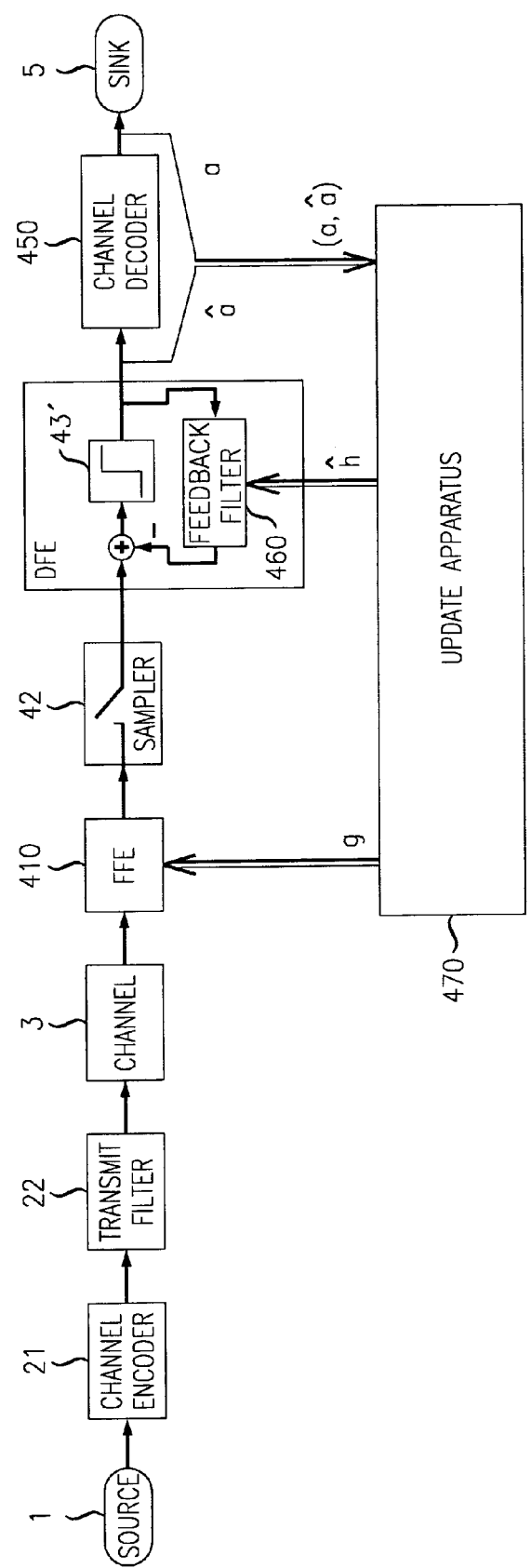
FIG. 1 is schematically depicting a transmission system with a receiver having a feed forward equalizer, a decision feedback equalizer and feedback loop means according to the invention.

Based on the afore description, the inventive approach preferably is incorporated within the transmission system as depicted in FIG. 1.

Regarding FIG. 1, the preferred inventive transmission system is derived from the transmission system of FIG. 7. In particular by using the bit errors which can be estimated by a forward error correction by means of the channel decoder 450, which may be similar to the decoder 45 of FIG. 7, an error rate evaluation is applied after the decoder 450 within an updating apparatus 470. Based thereon control values are generated within the updating apparatus 470 which allow to adjust both, the coefficients or table entries of the feed forward equalizer 410 and the coefficients or table entries of the decision feedback equalizer DFE, respectively.

To put the decision feedback equalizer DFE into practice, it preferably comprises at least the threshold decision device 43' and the feedback filter 460 corresponding to the feedback filter 46.

Such simultaneous adjustment of both equalizers, respectively, results in an approved error performance of the overall transmission system. The control value calculation is based on the digital data stream only, which can be created in any case by the described general receiver 4 so that a calculation does not need any additional detector or analogue to digital converter.

Moreover, the preferred embodiments of the inventive approach perform a calculation of the control values based on the following procedure, which can be accomplished advantageously by a simple digital circuit.

Practically, a block wise processing is assumed for decoding the digital symbols â after the decision device 43', and hence, based on the discussed preferred embodiment, after the feedback equalizer DFE. Therefore the decoded output symbols a of the decoder 450 are available with a certain delay only.

For example, $a_\mu \in \{1,-1\}$ is indicating the corrected symbols at the output of the decoder 450 at a time instant $\mu$, and $\hat{a}_\mu \in \{1,-1\}$ is indicating the delayed symbols at the output of the decision feedback equalizer DFE at a time instant $\mu$, wherein the appropriate time delay due to the delay of the decoder 450 should be adjusted such that a maximum average agreement of $\hat{a}_\mu$ and $a_\mu$ is achieved.

Based thereon, $e_\mu(D)$ denotes a control signal at the time instant $\mu$, which may result from $a_\mu$ and $\hat{a}_\mu$ as follows:

$$e_\mu(D) = \begin{cases} a_\mu - \hat{a}_\mu, & \text{if } a_{\mu-D} < 0 \\ -a_\mu + \hat{a}_\mu, & \text{if } a_{\mu-D} \geq 0 \end{cases},$$

and $\hat{e}_\mu(D)$ denotes a control signal at time instant $\mu$, which may result from $a_\mu$ and $\hat{a}_\mu$ as follows $$\hat{e}_\mu(D) = \begin{cases} a_\mu - \hat{a}_\mu, & \text{if } \hat{a}_{\mu-D} \geq 0 \\ -a_\mu + \hat{a}_\mu, & \text{if } \hat{a}_{\mu-D} < 0 \end{cases},$$

wherein D is a variable indicating a respective delay lines or taps, such as the delay lines or taps 411 and 461 of the feed forward equalizer or the decision feedback equalizer structure, as depicted in FIG. 3 or 2 and has to be correspondingly assigned to each tab.

Using these control signals a possible adaptation rule for the individual FFE coefficients of FIG. 3 is preferably $$g_0^{n+1} = g_0^n + \gamma \cdot \sum_\mu e_\mu(-V)$$

$$g_1^{n+1} = g_1^n + \gamma \cdot \sum_\mu e_\mu(-V+1)$$

$$g_2^{n+1} = g_2^n + \gamma \cdot \sum_\mu e_\mu(-V+2)$$

$$\vdots$$

$$g_{V-1}^{n+1} = g_{V-1}^n + \gamma \cdot \sum_\mu e_\mu(-1)$$

$$g_V^{n+1} = 1$$

where □ denotes the adaptation step size.

The last coefficient $g_V^{n+1}$ may be chosen arbitrarily and/or may result from all other coefficients in case of a normalized equalizer energy for example.

In a similar way, the coefficients of a decision feedback equalizer comprising a linear feedback filter, as depicted in FIG. 2, are preferably adapted by the following iteration rule $$\hat{h}_1^{n+1} = \hat{h}_1^n + \gamma \cdot \sum_\mu \hat{e}_\mu(1)$$

$$\hat{h}_2^{n+1} = \hat{h}_2^n + \gamma \cdot \sum_\mu \hat{e}_\mu(2)$$

$$\vdots$$

$$\hat{h}_L^{n+1} = \hat{h}_L^n + \gamma \cdot \sum_\mu \hat{e}_\mu(L)$$

After a respective new adaptation of new coefficients g and/or ĥ, i.e. $g_i^{n+1}$ and/or $\hat{h}_i^{n+1}$, as required or intended, they are forwarded to the feed forward equalizer 410 and to the feedback filter 460 of the decision feedback equalizer, respectively, for applying the newly adapted equalization functionality to the transmission signal received from the transmission channel 3.

Thus using the error correction capability of channel coding and the error evaluation after the channel decoder 450 according to the invention with the corresponding control value generation, it is possible to adjust all employed equalizers or detectors adaptively to the channel 3 without any additional measurement device requiring the received signal. Thereby, neither monitoring of the analogue signal by an extra circuitry nor dithering of the coefficients is necessary to find an optimum equalizer setup.

Furthermore, the number of equalizer coefficients is not restricted and hence, the inventive approach can be accordingly adapted such, that in particular for a decision feedback equalizer having a nonlinear structure with table entries of a plurality of coefficients the above stated rule may also be applied in a correspondingly modified form.

Moreover, based on respective specific applications of the invention, the number of the slit symbols and/or the coefficients either with regard to the feed forward equalizer 410 or to the feedback filter 460 may be reduced down to zero. Thus the index "V" of the above adaptation rule for the individual FFE coefficients or the index "L" of the above adaptation rule for the individual DFE coefficients may be set to zero. Accordingly, the preferred embodiment of a combination of a feed forward equalizer and a subsequent decision feedback equalizer together with a decision device may be reduced to a feed forward equalizer and a subsequent decision device or to a decision feedback equalizer together with a decision device.

It should be further mentioned, that the invention also is covering embodiments using instead of a forward error correction channel coding an error coding adapted for ARQ providing an error detection sufficient for performing a preferred evaluation of an error rate to derive therefrom corresponding coefficient adaptation control signals.

Numerous modifications and alternative embodiments of the invention will be apparent to those skilled in the art in view of the foregoing description. Accordingly, this description is to be construed as illustrative only and is for the purpose of teaching those skilled in the art the best mode for carrying out the invention. Details of the structure and implementation of the various components described above can be varied substantially without departing from the spirit and scope of the invention, and exclusive use of all modifications that come within the scope of the appended claims is reserved.

We claim:

1. A method of processing a received transmission signal adapted for the use within a high rate communication system, wherein the method comprises the steps of:
performing on the received signal a feed forward equalization and a decision feedback equalization by
deriving information from the equalized signal after a signal decision is performed,
adjusting intended feed forward equalization coefficients and decision feedback equalization coefficients or table entries depending on said information,
further comprising the steps of performing a forward error correction on said equalized signal, generating control values in dependence on symbols of the equalized signal prior to said error correction and symbols of the corrected signal at defined time instants,
further comprising the step of adapting each equalization coefficient or table entry in dependence on a respective previous equalization coefficient or table entry and on said control values, in particular based on a selectable adaptation step size parameters,
and further comprising adjusting an appropriate time delay for ensuring a maximum average agreement of corrected symbols and decided output symbols at defined time instants.

2. The method of claim 1, further comprising the steps of deriving digital adaptation information periodically at definable time instants and feeding back said information for adaptively adjusting intended feed forward equalization coefficients and/or decision feedback equalization coefficients or table entries simultaneously.

3. A method as claimed in claim 1, wherein the transmission signal comprises an error or channel coding information and wherein the method further comprises the step of performing an error rate evaluation based on said coding information for generating control values for adjusting the intended feed forward equalization coefficients and/or decision feedback equalization coefficients or table entries depending on said information.

4. A method as claimed in claim 1 wherein linear and/or non-linear equalization coefficients are adjusted.

5. A receiver for a high rate communication system, comprising a feed forward equalizer and a decision feedback equalizer with said equalizer(s) connected to a signal detection device having
means for receiving a transmission signal,
means for deriving information from the transmission signal after said signal detection device,
updating means for adjusting all intended feed forward equalization coefficients and decision feedback equalization coefficients or table entries in dependence on said information,
further comprising means for decoding digital symbol after said decision feedback periodically at definable time instants, and mean for performing an error rate evaluation based on channel or error coding information embedded within the transmission signal, and means for generating adaptation control values using said error rate evaluation,
further comprising means for performing a forward error correction, means for generating adaptation control values in dependence on corrected symbols and decided detection device output symbols at defined time instants, and means for adapting each intended equalization coefficient or table entry in dependence on the respective previous equalization coefficient or table entry and on said control values, in particular based on a selectable adaptation step size parameter,
and further comprising means for adjusting an appropriate time delay for ensuring a maximum average agreement of corrected symbols and decided output symbols at defined time instants.

* * * * *